United States Patent
Abdul-Ridha et al.

(10) Patent No.: US 6,836,400 B2
(45) Date of Patent: Dec. 28, 2004

(54) STRUCTURES BASED ON CERAMIC TANTALUM NITRIDE

(75) Inventors: Hadi Abdul-Ridha, Costa Mesa, CA (US); David T. Young, Irvine, CA (US); Maureen R. Brongo, Laguna Hills, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 09/761,489

(22) Filed: Jan. 16, 2001

(65) Prior Publication Data
US 2001/0017757 A1 Aug. 30, 2001

Related U.S. Application Data

(62) Division of application No. 09/512,397, filed on Feb. 24, 2000, now Pat. No. 6,251,796.

(51) Int. Cl.[7] .............................................. H01G 4/06
(52) U.S. Cl. ................. 361/311; 361/321.1; 361/321.2; 361/306.3; 361/313; 361/308.1; 361/308.3
(58) Field of Search ................. 361/311, 312, 361/313, 306.1, 306.3, 308.2, 308.3, 321.1, 321.2, 301.2, 303, 321.5, 305, 306.2, 321.4; 438/396

(56) References Cited

U.S. PATENT DOCUMENTS

| | | | | |
|---|---|---|---|---|
| 4,714,952 A | * | 12/1987 | Takekawa et al. | 357/75 |
| 5,170,318 A | * | 12/1992 | Catala et al. | 361/323 |
| 5,741,626 A | * | 4/1998 | Jain et al. | 430/314 |
| 5,821,168 A | * | 10/1998 | Jain | 438/692 |
| 5,874,770 A | * | 2/1999 | Saia et al. | 257/536 |
| 5,973,908 A | * | 10/1999 | Saia et al. | 361/311 |
| 6,040,243 A | * | 3/2000 | Li et al. | 438/687 |
| 6,043,146 A | * | 3/2000 | Watanabe et al. | 438/623 |
| 6,072,689 A | * | 6/2000 | Kirlin | 361/311 |
| 6,084,765 A | * | 7/2000 | Lee | 361/311 |
| 6,146,959 A | * | 11/2000 | DeBoer et al. | 438/393 |
| 6,180,481 B1 | * | 1/2001 | Deboer et al. | 438/396 |
| 6,350,675 B1 | * | 2/2002 | Chooi et al. | 438/624 |
| 6,488,823 B1 | * | 12/2002 | Chiang et al. | 204/192.15 |

* cited by examiner

Primary Examiner—Dean A. Reichard
Assistant Examiner—Nguyen T. Ha
(74) Attorney, Agent, or Firm—Farjami & Farjami LLP

(57) ABSTRACT

A method for fabrication of ceramic tantalum nitride and improved structures based thereon is disclosed. According to the disclosed method, an ionized metal plasma ("IMP") tool is used to create a plasma containing tantalum ions where the plasma is sustained by a mixture of nitrogen and argon gases. The percentage of nitrogen partial flow in the mixture of gases is adjusted so as to result in a layer of tantalum nitride with a nitrogen content of at least 30%. With a nitrogen content of at least 30%, the tantalum nitride becomes ceramic. The ceramic tantalum nitride presents a number of advantages. For example, the fabrication of ceramic tantalum nitride can be easily incorporated into fabrication of semiconductor chips using copper as the interconnect metal. Also, ceramic tantalum nitride can be used as an effective etch stop layer. The reason is that ceramic tantalum nitride does not react with fluoride which is a typical constituent of etchants utilized to etch silicon-based dielectrics such as silicon dioxide. Further, ceramic tantalum nitride can be used as a dielectric in fabrication of a capacitor stack using copper electrodes. Since fabrication of ceramic tantalum nitride is easily assimilated with fabrication of copper, the capacitor stack utilizing ceramic tantalum nitride can be built in a single IMP tool along with the copper electrodes. The result is higher throughput and a reduced risk of contaminating the semiconductor wafer since there is no need to "break vacuum" for a separate fabrication of the dielectric layer.

32 Claims, 4 Drawing Sheets

STRUCTURES BASED ON CERAMIC TANTALUM NITRIDE

This is a divisional of application Ser. No. 09/512,397 filed Feb. 24, 2000 now U.S. Pat. No. 6,251,796.

BACKGROUND OF THE INVENTION

1. Field of the Invention

The present invention is generally in the field of materials used in semiconductor chips. In particular the present invention is in the field of ceramics and dielectrics used in semiconductor chips.

2. Background Art

It is conventional in the art of fabrication of semiconductor chips to utilize ceramic materials for a variety of purposes. Ceramics can be used as insulators, capacitor dielectrics, barriers to diffusion, or barriers to etching. Semiconductor processing engineers continually search for new and improved non-metallic materials which can be used as insulators, capacitor dielectrics, barriers to diffusion, and barriers to etching. With the advent of copper as the interconnect metal of choice in semiconductor chips, there has come a need to accelerate the search for new and improved non-metallic materials that can be assimilated in fabrication processes which use copper as the interconnect metal.

Conventionally, tantalum nitride is fabricated using a nitrogen content of approximately 21% which results in a metallic tantalum nitride. Tantalum nitride has been used as a metallic barrier layer to prevent diffusion of copper in semiconductor chips. Fabrication of tantalum nitride, as a metal, has been integrated in fabrication processes which use copper as an interconnect metal. However, tantalum nitride has not, to applicants' knowledge, been fabricated in a ceramic mode. More particularly, a ceramic tantalum nitride has never been used in fabrication processes using copper as an interconnect metal.

Prior to the present invention, there has been no method of taking advantage of the fact that the process of fabricating the metallic tantalum nitride has been integrated into copper processes and that the same integration of the fabrication process could be advantageous when utilizing tantalum nitride in a ceramic mode. In fact, to applicants' knowledge, prior to the present invention there has been no attempt to use tantalum nitride as a ceramic in semiconductor chips.

Due to ease of integration of the fabrication of tantalum nitride (whether in metallic mode or in ceramic mode) in copper processes, a number of advantages can result from use of tantalum nitride as a ceramic. The entire process of fabricating a ceramic tantalum nitride can be done in the same tool where copper interconnect is fabricated and without a need to "breaking vacuum." In other words, a layer of the ceramic tantalum nitride could be fabricated as a dielectric above a copper interconnect segment without having to take the semiconductor wafer out of the vacuum chamber for a separate fabrication of the dielectric. The fact that the fabrication of the ceramic tantalum nitride can be accomplished in the same vacuum chamber where copper interconnect is fabricated results in a significant increase in throughput and also reduces risk of contaminating the wafer. In this manner, capacitor structures can be built with higher throughput while reducing the risk of wafer contamination.

Also, the conventional etch stop layer in semiconductor chips has been silicon nitride. Etching various semiconductor chip structures, such as vias, is typically performed using a carbon fluoride based plasma. As such, employing an etch stop layer such as silicon nitride is not ideal since silicon nitride reacts with fluoride. Use of a non-silicon based etch stop layer, such as the ceramic tantalum nitride, can provide a great advantage since ceramic tantalum nitride does not react with fluoride. As such, the ceramic tantalum nitride acts as a stronger etch stop layer than the conventional silicon nitride.

Thus, there is need in the art to consider an alternative ceramic material whose fabrication can be easily assimilated in copper fabrication processes and which also has advantages such as providing a good barrier to etching.

SUMMARY OF THE INVENTION

The present invention is a method for fabrication of ceramic tantalum nitride and improved structures based thereon. According to the present invention, an ionized metal plasma ("IMP") tool is used to create a plasma containing tantalum ions where the plasma is sustained by a mixture of nitrogen and argon gases. The percentage of nitrogen partial flow in the mixture of gases is adjusted so as to result in a layer of tantalum nitride with a nitrogen content of at least 30%. With a nitrogen content of at least 30%, the tantalum nitride becomes ceramic.

The ceramic tantalum nitride presents a number of advantages. For example, the fabrication of ceramic tantalum nitride can be easily incorporated into fabrication of semiconductor chips using copper as the interconnect metal. Also, ceramic tantalum nitride can be used as an effective etch stop layer. The reason is that ceramic tantalum nitride does not react with fluoride which is a typical constituent of etchants utilized to etch silicon-based dielectrics such as silicon dioxide.

Further, ceramic tantalum nitride can be used as a dielectric in fabrication of a capacitor stack using copper electrodes. Since fabrication of ceramic tantalum nitride is easily assimilated with fabrication of copper, the capacitor stack utilizing ceramic tantalum nitride can be built in a single IMP tool along with the copper electrodes. The result is higher throughput and a reduced risk of contaminating the semiconductor wafer since there is no need to "break vacuum" for a separate fabrication of the dielectric layer.

DETAILED DESCRIPTION OF THE INVENTION

The present invention is a method for fabrication of ceramic tantalum nitride and improved structures based thereon. The following description contains specific information pertaining to various equipment, materials, and layouts for implementation of the present invention. One skilled in the art will recognize that the present invention may be practiced with equipment, materials, and layouts different from those specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely example embodiments of the invention. To maintain brevity, other embodiments of the invention which use the principles of the present invention are not specifically described in the present application and are not specifically illustrated by the present drawings.

The metallic mode of tantalum nitride is well known in the art and is used extensively in semiconductor chips. As an example, the metallic mode of tantalum nitride has been used as a metallic barrier layer to prevent diffusion of copper into neighboring silicon or silicon dioxide regions. To applicants' knowledge, tantalum nitride has been thus far fabricated only in the metallic mode and not in an amorphous ceramic mode as is disclosed and taught in the present application. The present invention is thus directed to fabricating tantalum nitride in an amorphous ceramic mode and using it (i.e. the non-metallic tantalum nitride) as a dielectric in various structures in a semiconductor chip. The present application also discloses certain advantages in using the non-metallic tantalum nitride in semiconductor chips.

The invention utilizes an ionized metal plasma ("IMP") technology to fabricate tantalum nitride in a ceramic mode. Briefly, IMP is a deposition technology in which atoms sputtered from a metallic target are ionized in plasma before reaching the semiconductor wafer. The ions are attracted toward the wafer by an electrical charge and deposit thinly, yet uniformly, across the entire surface of the wafer. The plasma density associated with IMP is moderate and, therefore, presents a minimal risk of damaging devices on the semiconductor wafer. Film coverage can be precisely tuned using pressure, RF power, and bias parameters without compromising other film properties such as stress and uniformity.

Figure 1:
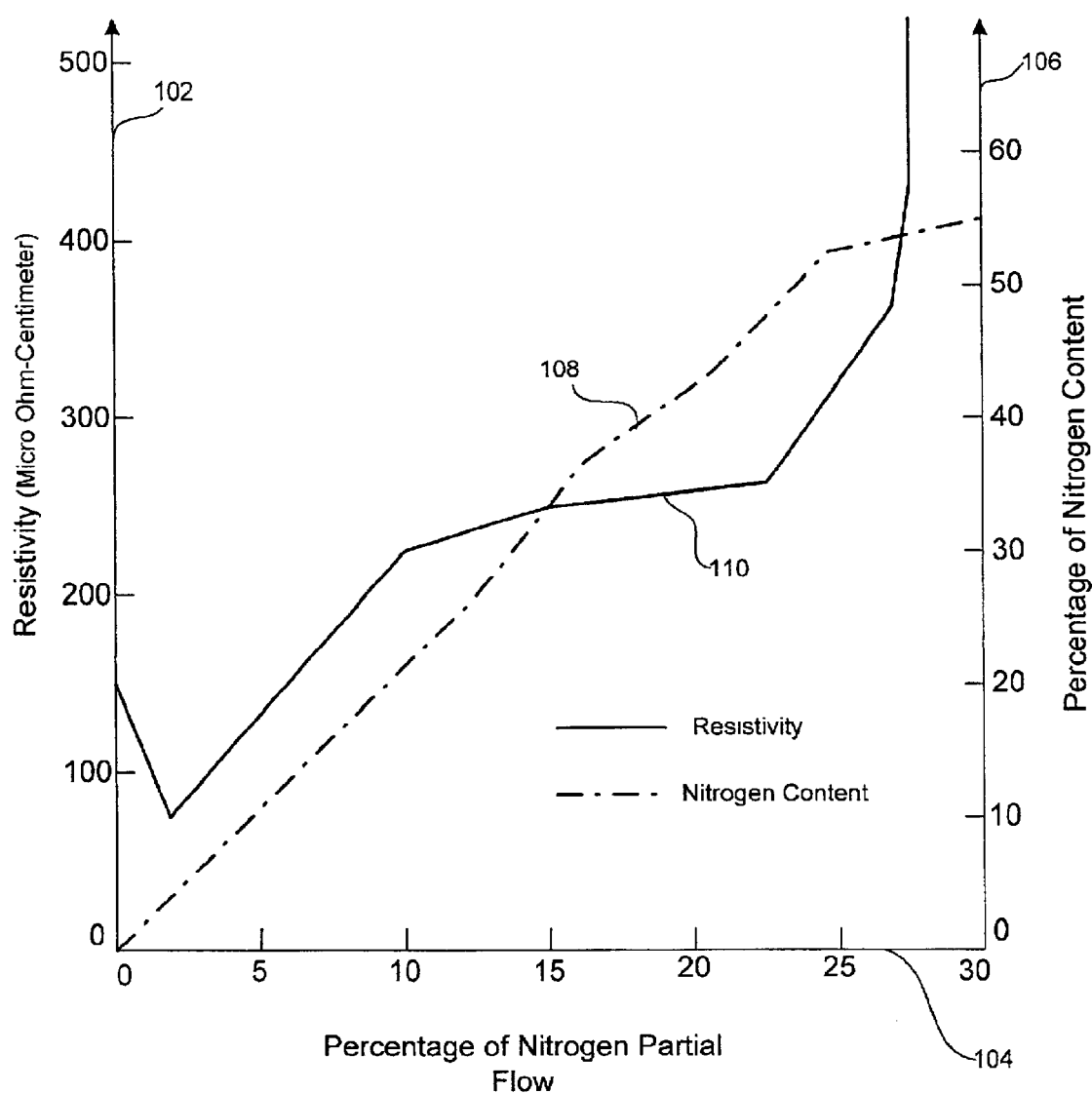
FIG. 1 is a graph illustrating the resistivity and nitrogen content of tantalum nitride as a function of the percentage of nitrogen partial flow.

By way of overview, to fabricate a ceramic tantalum nitride film according to the present invention, atoms from a tantalum target are sputtered and turned into tantalum ions in a plasma sustained by argon and nitrogen gases. FIG. 1 aids in describing how to fabricate a ceramic tantalum nitride film according to the present invention. FIG. 1 also illustrates some of the characteristics of the ceramic tantalum nitride film produced according to the present invention. Y-axis 102 corresponds to resistivity of the tantalum nitride film in micro ohms-centimeter (or $\mu\Omega$-cm), x-axis 104 corresponds to percentage of nitrogen partial flow in the argon-nitrogen gas mixture in the plasma, and y-axis 106 corresponds the percentage of nitrogen content.

FIG. 1 shows dashed curve 108 which represents the percentage of nitrogen content in the tantalum nitride film produced by ionized metal plasma technology according to the present invention. Solid curve 110 represents the resistivity of the tantalum nitride film of the present invention in micro ohms-centimeter. As shown in FIG. 1, both the percentage of nitrogen content in the tantalum nitride film represented by dashed curve 108 and the resistivity of the tantalum nitride film represented by solid curve 110 are functions of the percentage of nitrogen gas in the argon-nitrogen gas mixture sustaining the plasma.

Conventional tantalum nitride which is used in its metallic mode in semiconductor chips has a nitrogen content of approximately 21%. Referring to FIG. 1, this percentage of nitrogen content results in a resistivity of approximately 150 micro ohms-centimeter. This low resistivity corresponds to the metallic phase of tantalum nitride. The fact that tantalum nitride containing approximately 21% nitrogen is metallic is also manifest by other characteristics of the "21%-nitrogen" tantalum nitride. For example, X ray diffraction ("XRD") graphs show the metallic nature of the "21%-nitrogen" tantalum nitride. Briefly, X ray diffraction is a common method for determining the crystallinity of a substance. X ray diffraction is a phenomenon in which the atoms of a crystal, by virtue of their uniform spacing, cause an interference pattern of the waves present in an incident beam of X ray. The atomic planes of the crystal act on the X ray in exactly the same manner as does a uniformly ruled grating on a beam of light. A detection device in an XRD tool determines the intensity of diffracted X ray which is an indication of the crystallinity of the matter under analysis. In its metallic mode, tantalum nitride is crystalline and its XRD graph has a relatively high intensity.

According to the present invention, an IMP tool is utilized to increase the percentage of nitrogen partial flow in the argon-nitrogen gas mixture to a degree such that the percentage of nitrogen content in the tantalum nitride reaches approximately 60% as opposed to the 21% present in the metallic tantalum nitride. With a nitrogen content of approximately 60%, tantalum nitride becomes ceramic and can be used to fabricate various unique semiconductor structures. As seen in FIG. 1, tantalum nitride becomes highly resistive at nitrogen content of 60% which is an indication that it (i.e. tantalum nitride) is in a non-metallic (i.e. ceramic) mode. In one measurement, the resistivity of the ceramic tantalum nitride was determined to be 1.25 giga ohm-centimeter. Resistivity of 1.25 giga ohm-centimeter is a clear indication that the tantalum nitride is in a ceramic mode.

Figure 2:
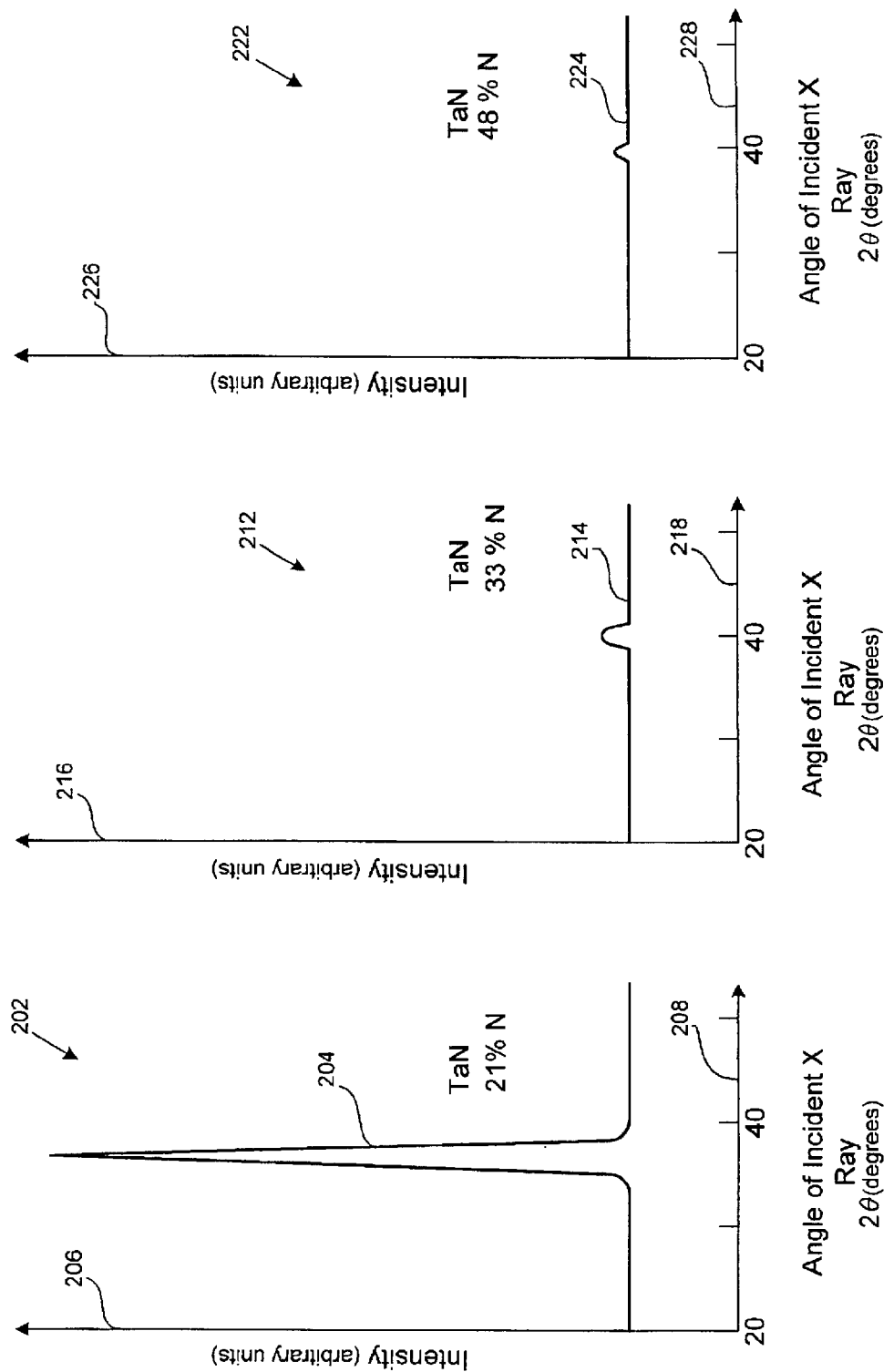
FIG. 2 illustrates the intensity of diffracted X ray for three separate samples of tantalum nitride having different nitrogen contents.

Another indication that tantalum nitride with nitrogen content of 60% is an amorphous ceramic is the low intensity of the diffracted X ray in its XRD graph. Referring to XRD graphs 202, 212, and 222 in FIG. 2, y-axes 206, 216, and 226 correspond to the intensity of the diffracted X ray while x-axes 208, 218, and 228 correspond to the angle of the X ray incident on the tantalum nitride sample. Curves 204, 214, and 224 show the intensities of the diffracted X ray from tantalum nitride samples having, respectively, nitrogen contents of 21%, 33%, and 48%. Comparing curves 204, 214, and 224, it is seen that the intensity of the diffracted X ray for tantalum nitride with a nitrogen content of 21% (curve 204) is much greater than the intensity of the diffracted X ray for tantalum nitride with nitrogen content of 33% (curve 214) or 48% (curve 224). The fact that tantalum nitride samples with nitrogen contents of 30% and 48% result in a much lower intensity of the diffracted X ray indicates that their structures are not crystalline. Moreover, the intensity of the diffracted X ray for tantalum nitride with a nitrogen content of 60% is even less than those for tantalum nitride with nitrogen contents of 33% and 48%. Accordingly, tantalum nitride fabricated according to the present invention with a nitrogen content of greater than 30% is an amorphous ceramic substance.

Figure 3:
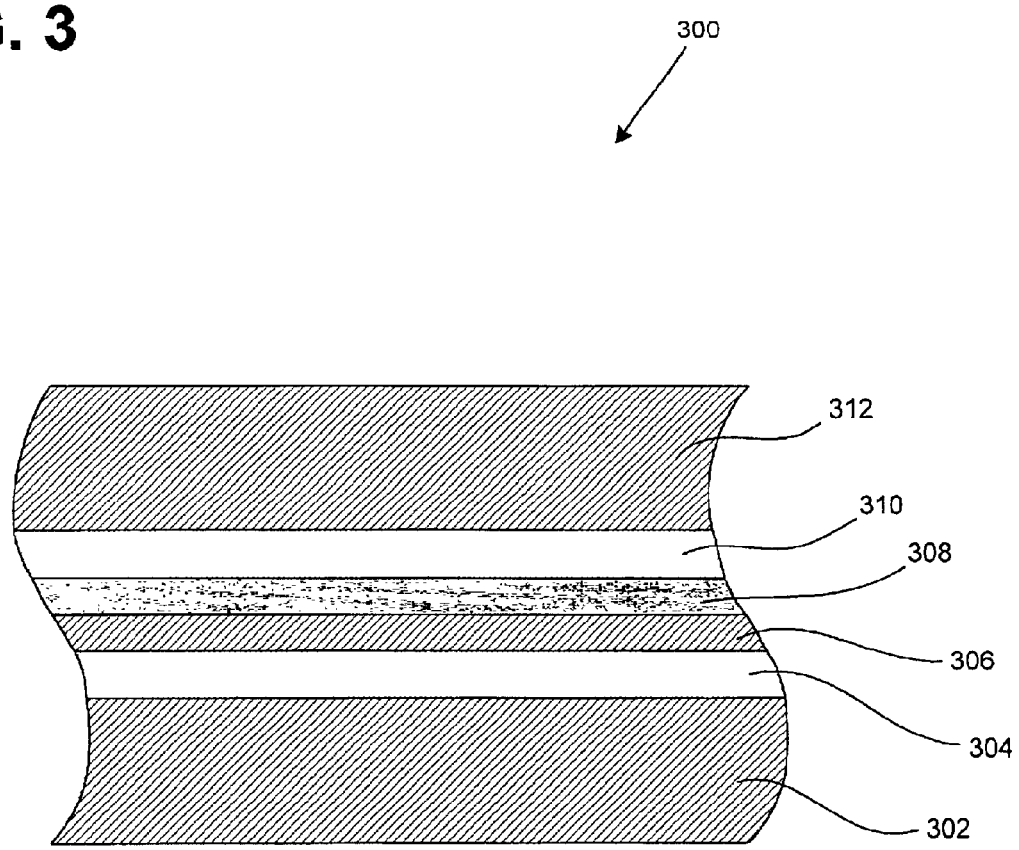
FIG. 3 shows a capacitor stack fabricated utilizing a ceramic tantalum nitride dielectric according to the present invention.

As stated above, the ceramic tantalum nitride achieved by the present invention can be used advantageously in fabrication of a number of unique structures in semiconductor chips. By way of example and referring to FIG. 3, the invention's ceramic tantalum nitride is used to fabricate a capacitor stack 300. Capacitor stack 300 comprises bottom interconnect metal layer one segment 302 which is made of copper. On top of bottom interconnect metal layer one segment 302 is a metallic tantalum nitride barrier layer 304. Metallic tantalum nitride barrier layer 304 is deposited on copper metal layer one segment 302 by employing an ionized metal plasma ("IMP") tool utilizing a tantalum target and adjusting the percentage of nitrogen partial flow in the argon-nitrogen gas mixture sustaining the plasma to a level so as to result in a metallic tantalum nitride film with a nitrogen content of approximately 21%. Metallic tantalum nitride barrier layer 304 is used to prevent diffusion of copper interconnect metal layer one segment 302.

Thin copper seed layer 306 is then electroplated on top of metallic nitride barrier layer 304. Copper seed layer 306 is electroplated using the same IMP tool in which metallic tantalum nitride barrier layer 304 was deposited on copper interconnect metal layer one segment 302. On top of copper seed layer 306 the invention's ceramic tantalum nitride layer 308 is deposited using the same IMP tool. The invention's ceramic tantalum nitride layer 308 is deposited by using the same tantalum target that was used to fabricate metallic tantalum nitride layer 304. However, as explained earlier, the percentage of nitrogen partial flow in the argon-nitrogen gas mixture sustaining the plasma is increased to a degree so as to result in a nitrogen content of approximately 60% in the resulting ceramic tantalum nitride film.

Ceramic tantalum nitride layer 308 acts as a dielectric in capacitor stack 300. The dielectric constant of ceramic tantalum nitride layer 308 is approximately 10. This dielectric constant is even higher than the dielectric constant of silicon nitride which is conventionally used to fabricate high capacitance density capacitors (the dielectric constant of silicon nitride is approximately 8). As such, ceramic tantalum nitride layer 308 in fact results in a capacitor having a relatively high capacitance density.

Using the same IMP tool, metallic tantalum nitride barrier layer 310 is deposited on top of ceramic tantalum nitride layer 308. This is accomplished by utilizing the same tantalum target that was used to fabricate metallic tantalum nitride layer 304 and ceramic tantalum nitride layer 308. However, the percentage of nitrogen partial flow in the argon-nitrogen gas mixture sustaining the plasma is adjusted to a level so as to result in a metallic tantalum nitride film with a nitrogen content of approximately 21%. Metallic tantalum nitride barrier layer 310 is used to prevent diffusion of copper interconnect metal layer two segment 312 which is fabricated on top of metallic tantalum nitride layer 310.

Finally, an interconnect metal layer two segment 312 which is made of copper is fabricated on top of metallic tantalum nitride barrier layer 310. Interconnect metal layer one segment 302 acts as a first electrode while interconnect metal layer two segment 312 acts as a second electrode for capacitor stack 300. The invention's capacitor stack 300 which utilizes a novel ceramic tantalum nitride layer 308 as a dielectric has a number of advantages over conventional capacitor structures in semiconductor chips.

One advantage of the invention's capacitor stack 300 is that it is fabricated in a single IMP tool without having to remove the semiconductor wafer from the IMP tool for fabrication of the dielectric tantalum nitride layer 308. In other words, the invention does not require that "vacuum be broken" and as such the invention results in a streamlined fabrication process for capacitor stack 300. The fact that the invention avoids "breaking vacuum" and that the invention uses the same IMP tool for fabrication of all the different layers of capacitor stack 300 is significant since a higher throughput and a higher degree of automation is achieved. Moreover, the risk of contaminating the semiconductor wafer is reduced, resulting in a lower defect density. Another advantage of the invention's capacitor stack 300 is that, as stated above, ceramic tantalum nitride layer 308 has a relatively high dielectric constant which results in a high capacitance density for capacitor stack 300.

Another example of an advantageous use of the ceramic tantalum nitride achieved by the present invention is its use as an "etch stop" layer. For example, it is conventional to use an etch stop layer when etching vias in semiconductor chips. The etch stop layer is intended to prevent overetching the via hole since overetching would result in which etching away any metal or dielectric under the intended via hole.

Figure 4:
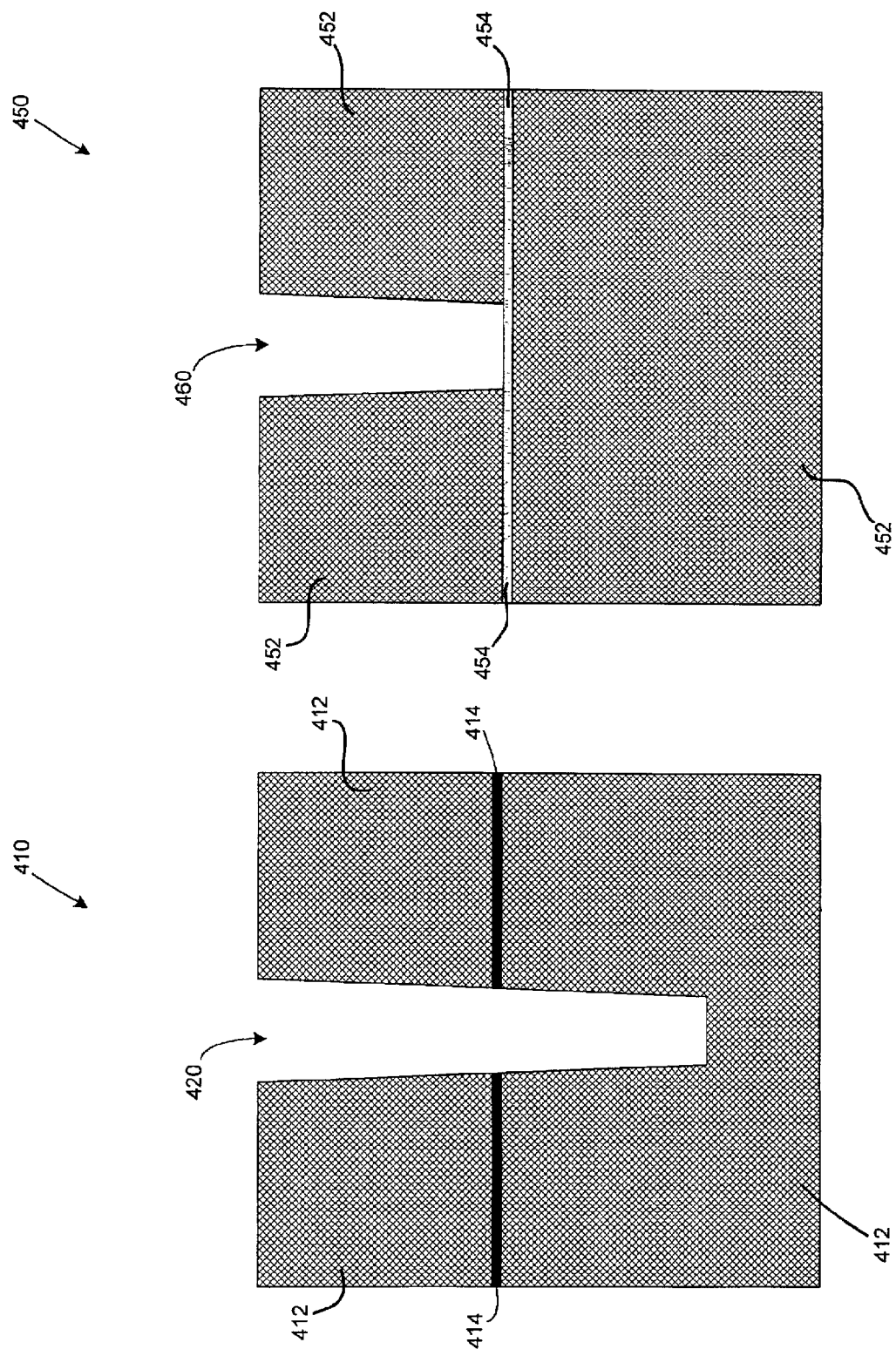
FIG. 4 shows a via structure utilizing ceramic tantalum nitride as an etch stop layer according to the present invention and a different via structure utilizing silicon nitride as the etch stop layer.

A conventional etch stop material used for controlling the etching of via holes is silicon nitride. Referring to FIG. 4, via structure 410 shows via hole 420 which is etched in dielectric 412. Dielectric 412 is typically silicon dioxide, however, it can be another dielectric and in particular a low dielectric constant ("low-k") dielectric such as fluorinated silicon dioxide (also called "FSG"). Via structure 410 utilizes etch stop layer 414 which is made of silicon nitride. It is probable that an interconnect metal segment is situated below etch stop layer 414. However, in order to simplify the present discussion, instead of an interconnect metal segment, dielectric 412 is shown as occupying the area below etch stop layer 414.

As shown in via structure 410, it is possible to significantly overetch via hole 420 and etch away silicon nitride etch stop layer 414 and in fact etch far below the silicon nitride etch stop layer. The reason for the unintended overetching of via hole 420 is that dielectric 412 and etch stop layer 414 are both silicon-based materials, i.e. dielectric 412 is made of silicon dioxide and etch stop layer 414 is made of silicon nitride. As such, it is difficult to selectively etch silicon dioxide dielectric 412 without etching silicon nitride etch stop layer 414. In particular, it is conventional to use a carbon fluoride based plasma as the etchant for etching via hole 420 in silicon dioxide dielectric 412. Since fluoride reacts with and etches silicon, it is quite possible to unintendedly etch away some or all of silicon nitride etch stop layer 414 when etching via hole 420.

In contrast to the overetching phenomenon shown in via structure 410, via structure 450 in FIG. 4 shows that via hole 460 is properly etched in dielectric 452 without etching below etch stop layer 454. In via structure 450, like via structure 410, dielectric 450 is typically silicon dioxide or a low-k dielectric such as fluorinated silicon dioxide. However, etch stop layer 454 is made from the invention's ceramic tantalum nitride. As stated in relation to via structure 410, it is probable that an interconnect metal segment is situated below etch stop layer 454. However, in order to simplify the present discussion, instead of an interconnect metal segment, dielectric 452 is shown as occupying the area below etch stop layer 454.

Unlike the silicon nitride etch stop layer in via structure 410, the invention's ceramic tantalum nitride etch stop layer 454 in via structure 450 does not react with the carbon fluoride based plasma which is the etchant used to etch silicon dioxide dielectric 452. Accordingly, the dielectric below tantalum nitride etch stop layer 454 remains intact as shown in via structure 450 in FIG. 4.

From the above description of the invention, it is manifest that various equipment, materials, and layouts can be used for implementing the concepts of the present invention without departing from its scope. Moreover, while the invention has been described with specific reference to certain embodiments, equipment, materials, and layouts, a person of ordinary skills in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, a method for fabrication of ceramic tantalum nitride and improved structures based thereon has been disclosed.

What is claimed is:

1. A structure comprising:
   a first capacitor electrode;
   a second capacitor electrode;
   a dielectric comprising ceramic tantalum nitride situated between said first and second capacitor electrodes, said dielectric comprising ceramic tantalum nitride having a nitrogen content of at least 30%;
   a first and a second layer of metallic tantalum nitride, said first layer of metallic tantalum nitride being situated between said dielectric comprising ceramic tantalum nitride and said first capacitor electrode and said second layer of metallic tantalum nitride being situated between said dielectric comprising ceramic tantalum nitride and said second capacitor electrode.

2. The structure of claim 1 wherein said first capacitor electrode is made of copper.

3. The structure of claim 1 wherein said second capacitor electrode is made of copper.

4. The structure of claim 1 wherein said dielectric comprising ceramic tantalum nitride is fabricated using a method comprising the steps of:
   utilizing an ionized metal plasma tool for creating a plasma containing tantalum ions, said plasma being sustained by a mixture of gases containing nitrogen;
   depositing said dielectric comprising ceramic tantalum nitride on said first capacitor electrode wherein a percentage of nitrogen partial flow in said mixture of gases is adjusted so as to cause said nitrogen content in said dielectric comprising ceramic tantalum nitride to be at least 30%.

5. The structure of claim 4 wherein said percentage of nitrogen partial flow in said mixture of gases is adjusted so as to cause said nitrogen content in said dielectric comprising ceramic tantalum nitride to be 60%.

6. A structure comprising:
   a first capacitor electrode comprising a bottom copper interconnect metal segment;
   a first barrier layer over said bottom copper interconnect metal segment;
   a copper seed layer over said first barrier layer;
   a dielectric comprising tantalum nitride over said copper seed layer;
   a second barrier layer over said dielectric;
   a second capacitor electrode comprising a top copper interconnect metal segment.

7. The structure of claim 6 wherein said structure is fabricated in a single ionized metal plasma tool.

8. The structure of claim 6 wherein said first capacitor electrode, said first barrier layer, said copper seed layer, said dielectric, said second barrier layer, and said second capacitor electrode are fabricated in a single ionized metal plasma tool.

9. The structure of claim 6 wherein said first barrier layer comprises metallic tantalum nitride.

10. The structure of claim 6 wherein said second barrier layer comprises metallic tantalum nitride.

11. The structure of claim 6 wherein said first barrier layer comprises metallic tantalum nitride having a nitrogen content of approximately 21%.

12. The structure of claim 6 wherein said second barrier layer comprises metallic tantalum nitride having a nitrogen content of approximately 21%.

13. The structure of claim 6 wherein said dielectric comprises tantalum nitride having a nitrogen content of at least 30%.

14. The structure of claim 6 wherein said dielectric comprises tantalum nitride having a nitrogen content of approximately 60%.

15. The structure of claim 6 wherein said dielectric comprises ceramic tantalum nitride.

16. The structure of claim 7 wherein a percentage of nitrogen partial flow in a mixture of gases in said ionized plasma tool is adjusted so as to cause a nitrogen content in each of said first and second barrier layers to be approximately 21%.

17. The structure of claim 7 wherein a percentage of nitrogen partial flow in a mixture of gases in said ionized plasma tool is adjusted so as to cause a nitrogen content in said dielectric to be to be at least 30%.

18. The structure of claim 7 wherein a percentage of nitrogen partial flow in a mixture of gases in said ionized plasma tool is adjusted so as to cause a nitrogen content in said dielectric to be approximately 60%.

19. A capacitor comprising:
   a first capacitor electrode comprising a bottom interconnect metal segment;
   a first barrier layer over said bottom interconnect metal segment;
   a seed layer over said first barrier layer;
   a dielectric over said seed layer;
   a second barrier layer over said dielectric;
   a second capacitor electrode comprising a top interconnect metal segment, wherein said bottom interconnect metal segment, said first barrier layer, said seed layer, said dielectric, said second barrier layer, and said top interconnect metal segment are fabricated in a single tool.

20. The structure of claim 19 wherein said single tool is a single ionized metal plasma tool.

21. The structure of claim 19 wherein said bottom interconnect metal segment comprises copper.

22. The structure of claim 19 wherein said top interconnect metal segment comprises copper.

23. The structure of claim 19 wherein said first barrier layer comprises metallic tantalum nitride.

24. The structure of claim 19 wherein said second barrier layer comprises metallic tantalum nitride.

25. The structure of claim 19 wherein said first barrier layer comprises metallic tantalum nitride having a nitrogen content of approximately 21%.

26. The structure of claim 19 wherein said second barrier layer comprises metallic tantalum nitride having a nitrogen content of approximately 21%.

27. The structure of claim 19 wherein said dielectric comprises tantalum nitride having a nitrogen content of at least 30%.

28. The structure of claim 19 wherein said dielectric comprises tantalum nitride having a nitrogen content of approximately 60%.

29. The structure of claim 19 wherein said dielectric comprises ceramic tantalum nitride.

30. The structure of claim 20 wherein a percentage of nitrogen partial flow in a mixture of gases in said ionized plasma tool is adjusted so as to cause a nitrogen content in each of said first and second barrier layers to be approximately 21%.

31. The structure of claim 20 wherein a percentage of nitrogen partial flow in a mixture of gases in said ionized plasma tool is adjusted so as to cause a nitrogen content in said dielectric to be at least 30%.

32. The structure of claim 20 wherein a percentage of nitrogen partial flow in a mixture of gases in said ionized plasma tool is adjusted so as to cause a nitrogen content in said dielectric to be approximately 60%.

* * * * *